US009419788B2

(12) United States Patent
Robertson et al.

(10) Patent No.: US 9,419,788 B2
(45) Date of Patent: *Aug. 16, 2016

(54) DATA TRANSFER CLOCK RECOVERY FOR LEGACY SYSTEMS

(71) Applicant: Texas Instruments Incorporated, Dallas, TX (US)

(72) Inventors: Iain Robertson, Bedford (GB); Richard Williams, Northampton (GB)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/808,969

(22) Filed: Jul. 24, 2015

(65) Prior Publication Data
US 2015/0333902 A1    Nov. 19, 2015

Related U.S. Application Data

(63) Continuation of application No. 13/755,609, filed on Jan. 31, 2013.

(30) Foreign Application Priority Data

Jan. 31, 2012 (GB) .................................. 1201580.6

(51) Int. Cl.
*H04L 7/00* (2006.01)
*H04L 25/00* (2006.01)
(Continued)

(52) U.S. Cl.
CPC ................ *H04L 7/04* (2013.01); *H03L 7/0807* (2013.01); *H03L 7/0814* (2013.01); *H04L 7/0016* (2013.01); *H04L 7/033* (2013.01); *H04L 7/0025* (2013.01)

(58) Field of Classification Search
CPC ..... H04L 7/033; H04L 7/0337; H04L 7/0338; H03L 7/0814; G06F 1/10
USPC .................................. 375/130–239, 242–377
See application file for complete search history.

(56) References Cited

U.S. PATENT DOCUMENTS 4,706,263 A * 11/1987 von der Embse ... H04L 27/2272
375/343
5,905,769 A * 5/1999 Lee ........................ H04L 7/0337
327/156

(Continued)

FOREIGN PATENT DOCUMENTS

GB          2473748 B        12/2011

OTHER PUBLICATIONS

Stauffer et al. "High Speed Serdes Devices and Applications", Springer, 2008, p. 116.

*Primary Examiner* — James M Perez
(74) *Attorney, Agent, or Firm* — Daniel Chan; Frank D. Cimino

(57) ABSTRACT

The present disclosure provides methods and apparatus for adapting a relatively high data rate second order SERDES receiver to receive relatively low data rate serial data, the receiver having a jog realignment by and having means for receiving the serial data as a plurality of repeated bits at the high data rate; framing the data as frames of repeated bits of the same value; examining the bits of the frame for the presence of bits which are not of the same value; upon detecting such a presence that is indicative of a framing error jogging the SERDES receiver for frame realignment; and supplying to an output of the SERDES receiver one of the bits of said same value from each frame at the low data rate.

20 Claims, 3 Drawing Sheets

(51) Int. Cl.
*H04L 25/40* (2006.01)
*H04L 7/04* (2006.01)
*H04L 7/033* (2006.01)
*H03L 7/08* (2006.01)
*H03L 7/081* (2006.01)

(56) References Cited

U.S. PATENT DOCUMENTS

| | | | | |
|---|---|---|---|---|
| 6,031,847 A * | 2/2000 | Collins | H04L 7/10 | 370/508 |
| 6,222,380 B1 * | 4/2001 | Gerowitz | C22C 21/08 | 326/37 |
| 6,430,242 B1 * | 8/2002 | Buchanan | G11C 7/1078 | 326/93 |
| 6,512,804 B1 * | 1/2003 | Johnson | H04J 3/0623 | 370/907 |
| 6,526,109 B1 * | 2/2003 | Chang | H03L 7/0812 | 327/158 |
| 6,563,355 B2 * | 5/2003 | Notani | H03L 7/0995 | 327/156 |
| 6,618,395 B1 * | 9/2003 | Kimmitt | H04L 1/004 | 370/473 |
| 6,678,842 B1 * | 1/2004 | Shaffer | H04L 1/0061 | 714/700 |
| 6,700,942 B1 * | 3/2004 | Lai | H04L 25/14 | 375/354 |
| 6,795,515 B1 * | 9/2004 | Riedle | H04L 7/0338 | 326/38 |
| 6,865,222 B1 * | 3/2005 | Payne | H04L 1/24 | 375/224 |
| 6,901,126 B1 * | 5/2005 | Gu | H03L 7/0998 | 375/354 |
| 7,102,446 B1 * | 9/2006 | Lee | H03K 23/507 | 331/11 |
| 7,277,031 B1 * | 10/2007 | Lo | H04L 7/0337 | 341/100 |
| 7,359,407 B1 * | 4/2008 | Mattos | H04L 25/14 | 370/509 |
| 7,426,252 B1 * | 9/2008 | Chuang | H04L 7/0338 | 375/219 |
| 7,568,137 B1 * | 7/2009 | Kellermann | H04L 7/0338 | 714/725 |
| 7,606,341 B2 * | 10/2009 | Pereira | H04L 7/0337 | 375/224 |
| 7,756,194 B1 * | 7/2010 | O'Connor | H04J 13/0074 | 375/142 |
| 7,782,990 B1 * | 8/2010 | Snow | H03L 7/08 | 375/355 |
| 8,000,425 B2 * | 8/2011 | Chan | H04L 7/033 | 375/354 |
| 8,015,429 B2 * | 9/2011 | Balamurugan | H03L 7/0814 | 375/316 |
| 8,223,828 B2 * | 7/2012 | Buchwald | H03L 7/0814 | 375/229 |
| 8,320,770 B2 * | 11/2012 | Nedovic | H03L 7/0807 | 398/154 |
| 8,363,770 B1 * | 1/2013 | Xue | H04L 7/0338 | 375/316 |
| 9,191,194 B2 * | 11/2015 | Robertson | H04L 7/04 | |
| 2002/0093986 A1 * | 7/2002 | Hendrickson | H03L 7/0814 | 370/503 |
| 2002/0097752 A1 * | 7/2002 | Jones | H04L 25/14 | 370/506 |
| 2002/0146084 A1 * | 10/2002 | Cranford, Jr. | H04L 7/0337 | 375/360 |
| 2003/0081709 A1 * | 5/2003 | Ngo | H03L 7/07 | 375/362 |
| 2003/0115542 A1 * | 6/2003 | Hwang | H03L 7/0995 | 714/798 |
| 2004/0085089 A1 * | 5/2004 | Yin | H03D 13/003 | 326/54 |
| 2004/0228396 A1 * | 11/2004 | Wood, Jr. | H04L 7/0079 | 375/220 |
| 2004/0247045 A1 * | 12/2004 | Marbot | H03L 7/091 | 375/316 |
| 2006/0098751 A1 * | 5/2006 | Zhang | H04L 27/2602 | 375/260 |
| 2006/0222095 A1 * | 10/2006 | Niu | H04L 27/2657 | 375/260 |
| 2007/0089002 A1 * | 4/2007 | Robertson | G01R 31/318572 | 714/726 |
| 2007/0140105 A1 * | 6/2007 | Coon | H04J 13/18 | 370/208 |
| 2007/0164802 A1 * | 7/2007 | Rea | H03F 3/505 | 327/266 |
| 2008/0031312 A1 * | 2/2008 | Haas | H04L 1/243 | 375/221 |
| 2009/0086870 A1 * | 4/2009 | Mohiuddin | H04L 25/0264 | 375/371 |
| 2009/0290671 A1 * | 11/2009 | Rea | H04L 25/0272 | 375/371 |
| 2011/0194659 A1 * | 8/2011 | Kenney | H03L 7/0807 | 375/355 |
| 2011/0194660 A1 * | 8/2011 | Kenney | H03L 7/0807 | 375/355 |
| 2012/0230454 A1 * | 9/2012 | Mobin | H04L 7/0083 | 375/354 |
| 2012/0269308 A1 * | 10/2012 | Huang | G06F 13/38 | 375/355 |
| 2012/0290885 A1 * | 11/2012 | Mobin | H04L 7/0337 | 714/56 |
| 2013/0070835 A1 * | 3/2013 | Sindalovsky | H03L 7/087 | 375/238 |
| 2013/0202072 A1 | 8/2013 | Robertson et al. | | |

* cited by examiner

DATA TRANSFER CLOCK RECOVERY FOR LEGACY SYSTEMS

RELATED APPLICATIONS

This application claims the benefit under 35 U.S.C. §120 of non-provisional application Ser. No. 13/755,609, filed Jan. 31, 2013, issued as U.S. Pat. No. 9,191,194 on Nov. 17, 2015, which claims priority under 35 USC §119(e)(1) of European Application Number GB 1201580.6, filed on Jan. 31, 2012. The entirety of the parent applications are incorporated herein by reference.

BACKGROUND

The present disclosure relates to clock recovery during data transfer in electrical systems. Transmitted data is usually synchronised to a clock signal at a transmitter to ensure correct timing of the transmitted data and compliance with specification in terms of jitter, etc. In systems where the clock signal is transmitted alongside the data, extraction of the data is the straightforward task of examining the data signal in synchronism with the clock. In systems where the clock is not so transmitted a replica clock may be recovered from the data itself and used likewise. For example 1000BASE-X and 10GBASE-KR Ethernet are single wire pair systems in which there is no clock transmission. In many situations (typically involving high speed, long distance or significant noise) clock recovery itself is a highly non trivial task.

It is neither always nor necessarily the case but single wire pair data transmission between or within equipment is often performed by a device which receives data to be transmitted in parallel from a source, renders it into serial form and transmits it, typically at higher speed, over the single wire pair to a second receiver device which includes a clock and data recovery circuit (CDR) to recover a clock signal so that the now serial data may be extracted an expanded back out to parallel form for use at the receiver location. Typically, both devices are similar so that transmission may occur in either direction. Such devices are often referred to as SerDes devices and a typical arrangement is depicted in FIG. 1, wherein it will be noted that the receiving serdes device is shown to include CDR circuitry.

The purpose of the clock recovery circuitry may be seen as identifying two neighbouring transitions (for example by oversampling the incoming data stream and looking for two adjacent non-matching oversampled values) and placing a data sampling point mid way between them to capture a data value. This is depicted in FIG. 2.

Of course not every adjacent data pair will be subject to transition and so the clock recovery circuitry may be free running to place sample points at equivalent positions until a next transition occurs. This makes CDR vulnerable to any jitter that was present in the original clock to which the data was synchronised. Clearly if that jitter resulted in transitions that were too close (or far apart), then the sample points are likely to be consistently too early (or late).

If jitter is too great, CDR can break down completely and steps must be taken to ensure this cannot happen. To this end, for example, most transmission specifications set an upper limit on jitter with which a receiver is expected to cope.

As SerDes speeds have increased, more and more complex clock recovery circuits have become available which incorporate corrections for various anticipated errors and difficulties. Examples are discussed in United Kingdom Patent Specification GB2,473,748B and numerous others. Usually CDR is either first order, in which a next sample point is determined from current measurements, or second order in which previous corrections are taken into account: GB2,473,748B is exemplary of both.

As mentioned above, the SERDES devices which communicate between or within equipment are usually similar in nature in that they perform to similar standards and protocols. However, this may not be the case where legacy equipment is involved. New equipment may be required to perform data transfer not only with similar new equipment but also with equipment which operates according to an earlier standard. In the field of data transfer, earlier often means slower. For example, it may be desired to interface equipment designed for 10GBASE Ethernet (10 GHz clock) with equipment designed for 1000BASE Ethernet (1 GHz clock). Fortunately, this should be achievable since the specification of 10GBASE Ethernet requires that transfer speed extend down to 1 GHz. However, if it were desired to connect the same equipment to legacy equipment conforming to 100BASE-FX (100 MHz clock), the situation would be different since 100 MHz is outside the range provided for in 10GBASE. Of course, the equipments may be physically connected together without electrical incompatibility but that does not means that data transfer is possible, the basic problem is that in the upstream direction (100BASE-FX to 10GBASE) the CDR circuitry in the SerDes device is unable to reliably recover a clock from data at the slower data rate.

In the downstream direction, data transfer would be possible if each bit to be transferred from the 10 G Serdes were simply repeated 10 times at the lowest permitted clock speed, thereby making the data appear to be clocked at 100 MHz. Since these bits would be synchronised to an internal clock of the Serdes which satisfies the jitter requirements of 10GBASE internet, they should be more than accurate enough for the 100BASE Serdes and downstream data transfer should work. The only overhead would be the repeat function, which likely could be accommodated in software configuring the SERDES.

In the upstream direction, unfortunately, the same approach cannot be used straightforwardly. Although at the upstream serdes the data could be regarded as arriving with each bit repeated 10 times and thus the problem potentially solved simply by discarding 9 bits out of each 10, it is in fact unlikely that the data could be recovered at all. If the slower clock were subject to 10% jitter, that is a whole bit time at the 1 G clock speed and clearly the upstream SERDES CDR circuit could not function at all with such ambiguity as the transition boundaries are entirely overlapping. A prudent designer would expect to allow for 20% deterioration from an ideal channel due to noise, jitter and inter symbol interference, so the scale of this problem may thus be appreciated.

Clearly a hardware solution at the downstream end is required to adapt the legacy equipment such as a data resynchroniser to a tightly specified clock or in the extreme a 1000BASE serdes itself. Unfortunately such difficulty and cost may negate the reasons for retaining the legacy equipment in the first place. According the present disclosure has been made in the course of realising a different approach of using resources within a typical 10 G serdes.

According to the present disclosure there is provided apparatus and method as set forth in the claims.

DETAILED DESCRIPTION

The present disclosure moreover provides method and apparatus for adapting a relatively high data rate second order serdes receiver to receive relatively low data rate serial data, the receiver having jog realignment and having means for receiving the serial data as a plurality of repeated bits at the high data rate; framing the data as frames of repeated bits of the same value; examining the bits of the frame for the presence of bits which are not of said same value; upon detecting such a presence that is indicative of a framing error jogging said serdes receiver for frame realignment; and supplying to an output of said serdes receiver one of the bits of said same value from each frame at said low data rate. The second order circuitry of said serdes receiver is used to impose a drift on said serial data of a magnitude greater than any expected drift or jitter on said serial data, the imposed drift being corrected as aforesaid.

Figure 1:
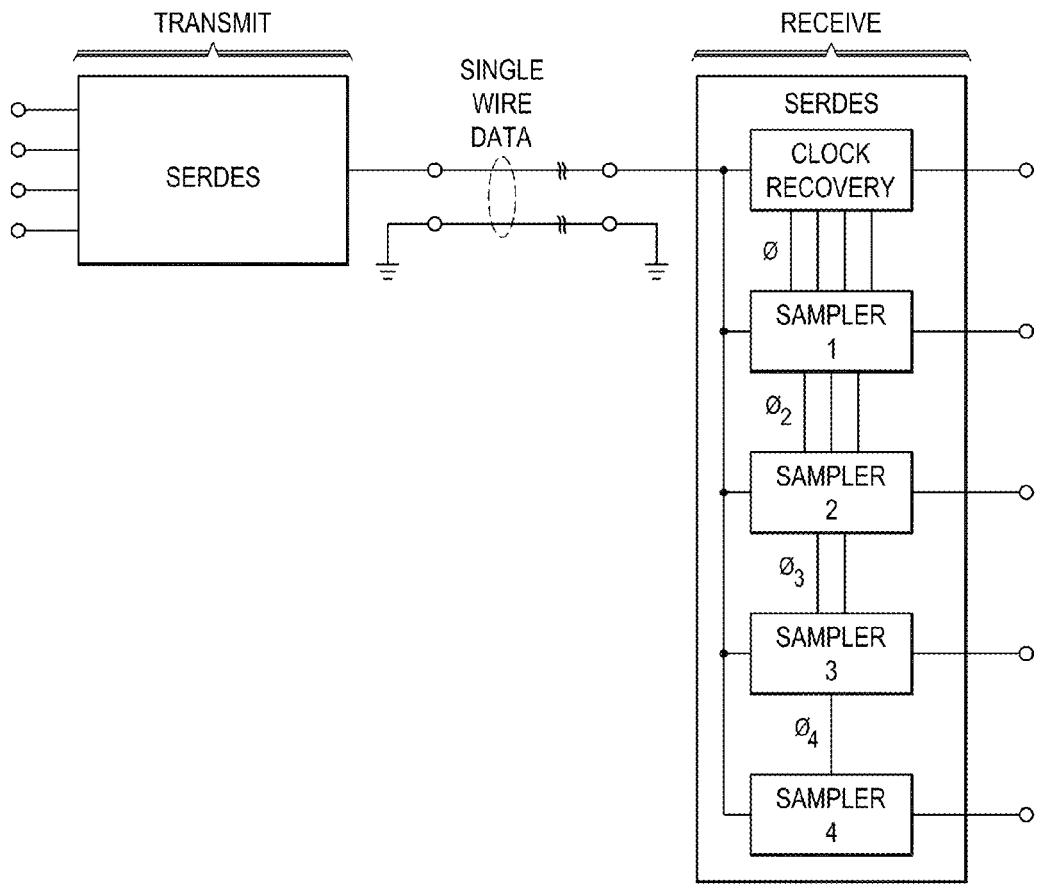
FIG. 1 is a block diagram of a Serializer/Deserializer (SerDes) device (Prior Art).
Figure 2:
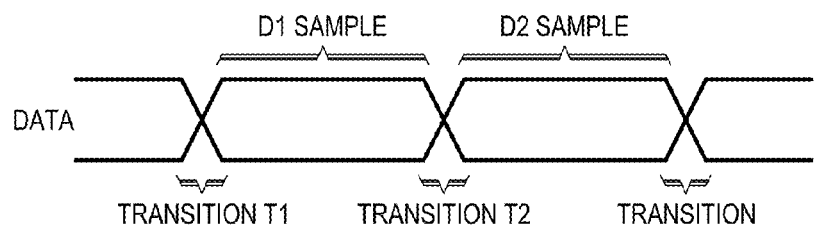
FIG. 2 is a timing diagram of clock recovery signals. (Prior Art)
Figure 3:
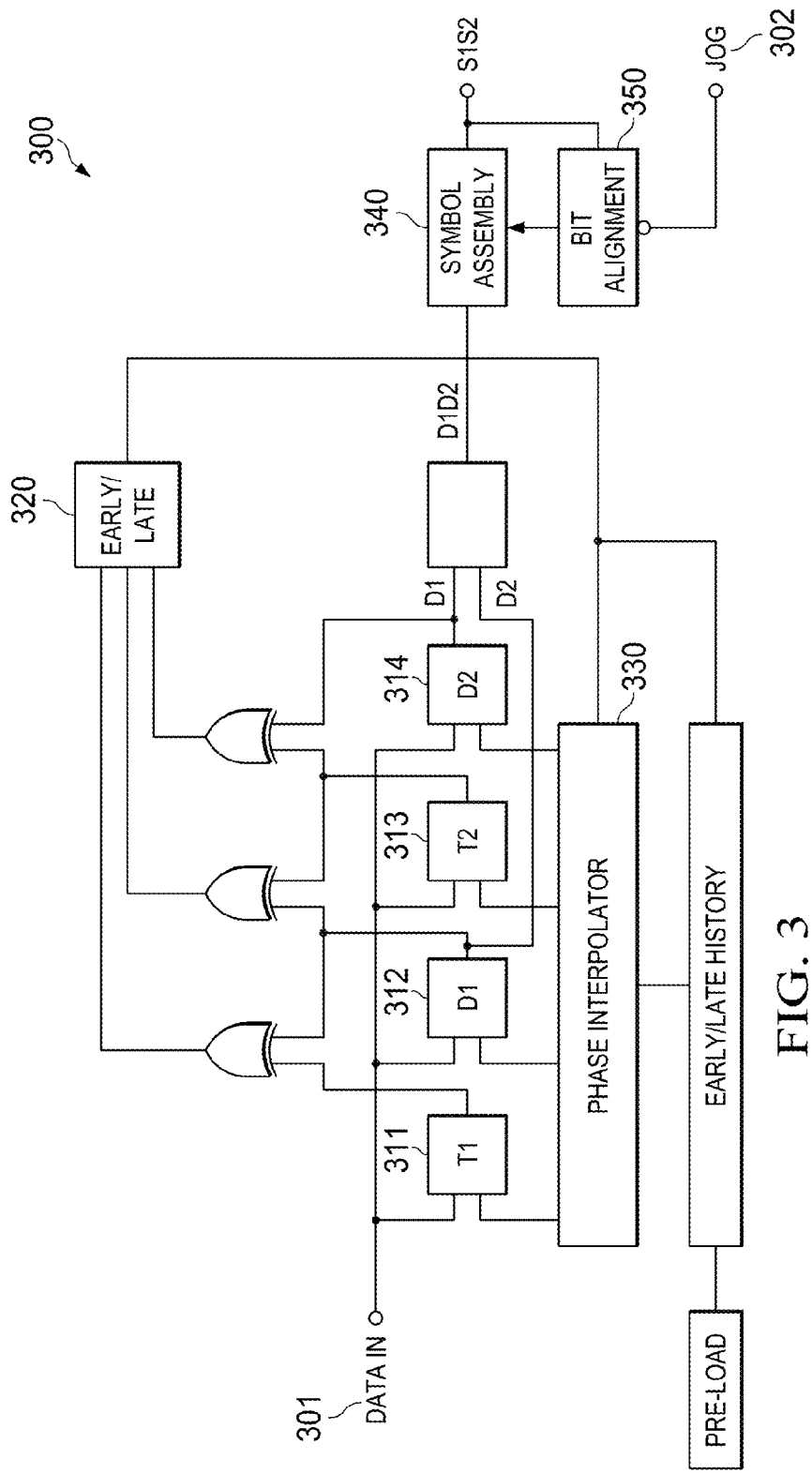
FIG. 3 is a schematic diagram of a SerDes arrangement according to an embodiment of the disclosure.

An exemplary serdes arrangement 300 as may benefit from an implementation of the present disclosure is depicted in FIG. 3. The serialised input data signal 301 is connected to for example four samplers (311, 312, 313, and 314) which take samples at progressive later phase points in the input cycle as defined by a phase interpolator. The samples correspond to two data samples D1 and D2 and two transition point samples T1 and T2, as described in FIG. 2.

A conventional bang-bang early/late detector 320 is used based upon comparing neighbouring samples. The operation of such an arrangement is well known and documented for example by Stauffer et al in "High Speed Serdes Devices and Applications", Springer, 2008; page 116. Suffice to say that the detector 320 serves to advance the sampling phases provided by the phase interpolator 330 if the sampling is late and to retard the sampling phases provided by the phase interpolator 330 if the sampling is early. Early/late history is recorded and may be used pre-emptively to advance or retard the phases if a long history of either all early or all late has been recorded. As such, the arrangement 300 constitutes a second order CDR arrangement.

The data samples are captured in order from the two samplers 312 and 314 and are fed to a symbol assembly circuit 340 where a plurality of consecutive samples (i.e. output bits) is framed into a symbol, word or byte. It is possible that even if the data bits have been correctly received, the framing is incorrect. A jog input 302 to the serdes is provided for the use of downstream data decoding equipment that may advance the framing by one bit at a time. This effectively moves the bit position of data either earlier or later in the frame.

The operation of such a serdes configured for fast (e.g. 10 G) reception will now be considered for the case where it receives data from a legacy (e.g. 100BASE) transmitter.

The serdes may be expected to sample signals down to a 1 G MHz, so the incoming data at 100 MHz may be considered as a repeated bit pattern, 10 repetitions at a time. The problem is that the data cannot be locked because the transitions are too far apart and outside the 10 G clock recovery specification.

Figure 4:
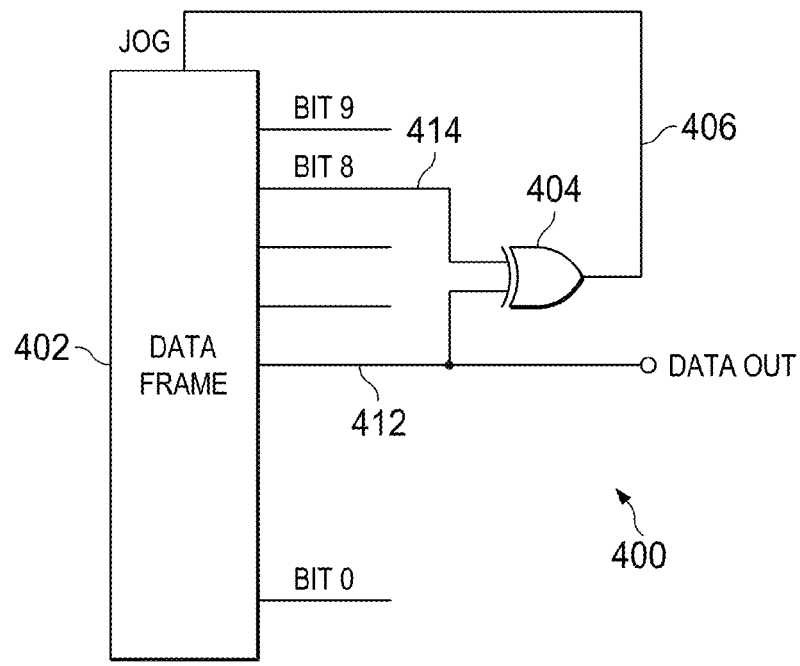
FIG. 4 is a schematic diagram of a circuit for clock recovery according to an embodiment of the disclosure.

FIG. 4 shows an arrangement 400 that implements the bit alignment circuit 350 as shown in FIG. 3. The arrangement 400 can alleviate this problem. The arrangement 400 includes a data frame register 402 and a comparator circuit 404. The data frame register 402 receives the frame of sampled bits from the symbol assembly 340. The data frame register 402 includes multiple frame bits depending on the size of the frame. In one implementation, for example, the data frame register 402 includes 10 frame bits (i.e., bit 0 to bit 9) when the reception data rate is about 10 times faster than the transmission data rate. The frame bits may be defined as a mid-frame bit 412 (e.g., bit 5) or a peripheral bit 419 (e.g., bit 8). The comparator circuit 404 compares the bit values of the mid-frame bit 412 and the peripheral bit 419. If these bit values are not the same, the comparator circuit 404 generates a jog signal 406 to realign the frame. The realignment may repeat until the mid-frame bit 412 and the peripheral bit 419 share the same bit value. In one implementation, the comparator circuit 404 may include an exclusive OR (XOR) transistor gate.

Figure 5A:
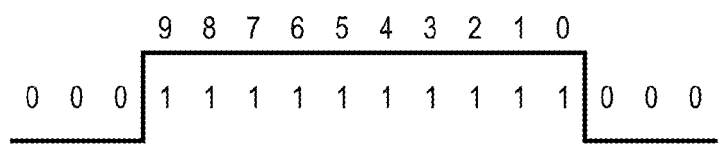
FIG. 5a is an illustration of a transition sequence with 10 consecutive bits according to an embodiment of the disclosure.

FIG. 5(a) shows a transition sequence with 10 consecutive bits. It will be observed that the 10 consecutive bit sequence is correctly framed and therefore bit 5 will be correctly delivered to the output as a value 1 for the single bit which this frame represents at the legacy data rate.

Figure 5B:
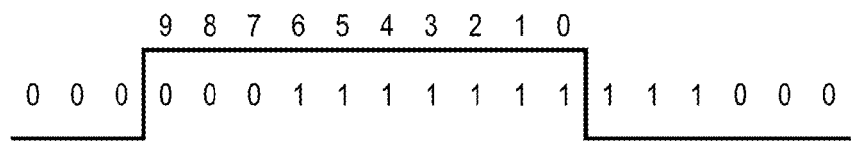
FIG. 5b is a an illustration of where data is being sampled too late and the data frame frame has slipped according to an embodiment of the disclosure.

FIG. 5(b) shows an example where the data is being sampled too late and the data frame has slipped, so that only 6 bits have the correct value. Since the slippage is to the point where compared bits 5 and 8 have different value, the arrangement 400 will institute a jog signal 406 which increases the sampling timing over one cycle. In the present case, this effectively skips one input bit to stretch the frame by creating an 11 bit frame so that the frame is realigned one bit earlier on the next sampling. It will be observed, however that a value of "1" (bit 5) is still correctly delivered as the output.

Clearly, if jitter or timing error were causing slippage in the opposite sense, an equivalent procedure could be implemented based on comparison of the higher order bits to institute an opposite jog to retard sampling.

Unfortunately, in typical serdes applications only an advancing jog is implemented. This is because since serdes circuitry is already operating at high speed, a reduction in sampling period is unrealistic. Moreover a delaying realignment (unlike an advancing realignment) is perfectly feasible in the receiving equipment and so there is no need for hardware in the serdes itself to provide such a function for the connected equipment.

In this situation the jog arrangement alone cannot be used for clock recovery as only late framing errors can be corrected.

In accordance with a further aspect of the present disclosure, a number representing a positive drift is loaded into the early/late history register of the serdes receiver, so that the sampling phase is advanced with respect to that determined by the bit rate. Now the situation is that the input data waveform is always sampled early and as a consequence will always drift toward the situation depicted in FIG. 5(b). However, this is not a problem, since it is precisely this form of timing error which may be routinely corrected by the jog mechanism described above.

For example, the 100BASE-FX standard allows for up to ±200 ppm of frequency offset. By loading a suitable number into the early/late history register, the SerDes will introduce an offset in the effective sampling of for example 256 ppm, shifting the possible net frequency offset to between +56 ppm and +456 ppm. This offset being always positive, the absence of an advancing jog function is overcome.

The choice of which bit to supply to the output is essentially arbitrary (since all 10 bits are the same), as is the choice of which bit to use to detect that the drift is causing the framing error to become severe, and the amount of correction to apply in terms of the number of bits by which the advance the timing when drift is detected. However, in accordance with the present disclosure, a comparison of bits that are separated by about a third of the overall frame length, for example bits 5 and 8 together with a one bit advance is considered advantageous for the 10 bit (single bit in legacy system) case. An advance of about 1 in 10 is also to advantage.

If the perceived advance is indeed due to drift, there are many schemes that could be made to work. However the perceived drift may in fact be jitter which may disappear or even reverse on a subsequent cycle. Hence is it advantageous to advance the framing by one bit only; it would be deleterious to advance by more in response to jitter. Examining bit 8 allows for two bits of potential jitter to cause no effect and bit 5 is delivered as the bit most insulated from the effect of jitter. Delivery of the bit at about the mid point of a frame is advantageous.

What is claimed is:

1. A deserializer circuit comprising:
   a sampler circuit configured to receive a stream of bits transmitted at a transmission rate and sample the received stream of bits at a reception rate higher than the transmission rate;
   a symbol assembly circuit coupled with the sampler circuit, and configured to group a portion of the sampled stream of bits into a frame; and
   a bit alignment circuit coupled with the symbol assembly circuit, and the bit alignment circuit configured to detect a frame slip when two sampled bits within the frame have different values, and upon detecting the frame slip, the bit alignment circuit configured to realign the frame until the two sampled bits share a same bit value representing a data bit output of the received stream of bits.

2. The deserializer circuit of claim 1, wherein the reception rate is at least 10 times of the transmission rate.

3. The deserializer circuit of claim 1, wherein the bit alignment circuit is configured to supply the same bit value of the two sampled bits as the data bit output of the received stream of bits.

4. The deserializer circuit of claim 1, wherein the bit alignment circuit includes:
   a data frame register configured to receive the frame of sampled bits from the symbol assembly circuit, the data frame register having a mid-frame bit and a peripheral bit configured to store the two sampled bits of the received frame; and
   a comparator circuit coupled with the data frame register to receive the mid-frame bit and the peripheral bit, the comparator circuit configured to generate a jog signal when the mid-frame bit is different from the peripheral bit, the jog signal causing the data frame register to realign the frame.

5. The deserializer circuit of claim 4, wherein the comparator circuit includes an XOR gate having a first input coupled to the mid-frame bit of the data frame register, and a second input coupled to the peripheral bit of the data frame register.

6. The deserializer circuit of claim 4, wherein the frame has 10 sampled bits including a fifth bit assigned as the mid-frame bit, and an eighth bit assigned as the peripheral bit.

7. The deserializer circuit of claim 4, wherein the mid-frame bit and the peripheral bit is separated by one-third of the frame of sampled bits.

8. The deserializer circuit of claim 1, wherein the bit alignment circuit is configured to realign the frame by shifting the frame by one-tenth of a length of the frame.

9. The deserializer circuit of claim 1, wherein:
   the frame has 10 sampled bits including a first bit and a tenth bit received after the first bit, and
   the bit alignment circuit is configured to realign the frame by shifting the frame towards the first bit.

10. The deserializer circuit of claim 1, wherein:
    the frame has 10 sampled bits including a first bit and a tenth bit received after the first bit, and
    the bit alignment circuit is configured to realign the frame by increasing the frame to include a zeroth bit received before the first bit.

11. The deserializer circuit of claim 1, wherein the sampler circuit is configured to drift the sampled stream of bits by a magnitude greater than an expected jitter of the received stream of bits.

12. A deserializer circuit comprising:
    a symbol assembly circuit configured to collect a stream of received bits into a frame having a frame length of bits; and
    a bit alignment circuit including:
      a data frame register coupled with the symbol assembly to receive the frame of received bits, the data frame register having a mid-frame bit and a peripheral bit configured to store two received bits of the frame length of bits; and
      a comparator circuit coupled with the data frame register to receive the mid-frame bit and the peripheral bit, the comparator circuit configured to generate a jog signal when the mid-frame bit is different from the peripheral bit, the jog signal causing the data frame register to realign the frame until the mid-frame bit and the peripheral bit share a same data bit representing an output data bit of the stream of received bits.

13. The deserializer circuit of claim 12, wherein:
    the comparator circuit is configured to detect the mid-frame bit and the peripheral bit share the same data bit; and
    upon detecting the same data bit, the data frame register is configured to deliver the same data bit as the output data bit of the stream of received bits.

14. The deserializer circuit of claim 12, wherein the comparator circuit includes an XOR gate having a first input coupled to the mid-frame bit of the data frame register, and a second input coupled to the peripheral bit of the data frame register.

15. The deserializer circuit of claim 4, wherein the mid-frame bit and the peripheral bit is separated by one-third of the frame length.

16. The deserializer circuit of claim 1, wherein the data frame register is configured to realign the frame by shifting the frame by one-tenth of the frame length.

17. A bit alignment circuit for use in a deserializer configured to sample a stream of bits, the bit alignment circuit comprising:
    a data frame register configured to store a frame length of sampled bits having a mid-frame bit and a peripheral bit; and
    a comparator circuit coupled with the data frame register to receive the mid-frame bit and the peripheral bit, the comparator circuit configured to generate a jog signal when the mid-frame bit is different from the peripheral bit, the jog signal causing the data frame register to realign the frame until the mid-frame bit and the peripheral bit share a same bit value representing an output data bit of the sampled bits.

18. The bit alignment circuit of claim 17, wherein the comparator circuit includes an XOR gate having a first input coupled to the mid-frame bit of the data frame register, and a second input coupled to the peripheral bit of the data frame register.

19. The deserializer circuit of claim 17, wherein the mid-frame bit and the peripheral bit is separated by one-third of the frame length.

20. The deserializer circuit of claim 17, wherein the bit alignment circuit is configured to realign the frame by shifting the frame by one-tenth of the frame length.

* * * * *